(12) United States Patent
Pennam et al.

(10) Patent No.: US 12,007,419 B2
(45) Date of Patent: Jun. 11, 2024

(54) SYSTEMS AND METHODS FOR GENERATOR CONTROL

(71) Applicant: Hamilton Sundstrand Corporation, Charlotte, NC (US)

(72) Inventors: Hemanth Kumar Pennam, Satyavedu (IN); Adrian E. Vandergrift, Rockton, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 552 days.

(21) Appl. No.: 17/235,377

(22) Filed: Apr. 20, 2021

(65) Prior Publication Data

US 2021/0344197 A1 Nov. 4, 2021

(30) Foreign Application Priority Data

Apr. 20, 2020 (IN) .............................. 202041016876

(51) Int. Cl.
*G01R 19/25* (2006.01)
*H03K 17/18* (2006.01)
(52) U.S. Cl.
CPC ......... *G01R 19/2513* (2013.01); *H03K 17/18* (2013.01)
(58) Field of Classification Search
CPC ... H03K 17/18; G01R 19/2513; Y04S 20/222; Y02B 70/3225
USPC ....................................................... 361/20
See application file for complete search history.

(56) References Cited

U.S. PATENT DOCUMENTS

| | | | |
|---|---|---|---|
| 4,631,474 A | 12/1986 | Dolland | |
| 5,898,557 A * | 4/1999 | Baba | H03K 17/18 |
| | | | 361/103 |
| 7,016,171 B2 * | 3/2006 | Bax | H01H 83/226 |
| | | | 361/45 |
| 7,304,828 B1 | 12/2007 | Shvartsman | |
| 8,536,821 B2 | 9/2013 | Kamenetz et al. | |
| 2017/0279443 A1 * | 9/2017 | Morimoto | H03K 17/693 |

OTHER PUBLICATIONS

Partial European search report issued in corresponding EP application No. 21169373.4, dated Sep. 23, 2021. (16 pages).
Extended European Search Report dated Jan. 3, 2022, issued during the prosecution of European Patent Application No. Ep 21169373.4, 13 pages.

* cited by examiner

*Primary Examiner* — Kevin J Comber

(57) ABSTRACT

A power quality monitor (PQM) module includes a solid-state semi-conductor switch having a voltage input, two signal inputs and two voltage outputs. A voltage input line is electrically connected to the voltage input. A PQM signal input line is operatively connected to at least one of the two signal inputs. A voltage output line is electrically connected to one of the two voltage outputs to provide power to a load. A method of controlling a GCB includes opening a solid-state semi-conductor switch when a PQM signal is powered at a first logic voltage. The method includes closing the solid-state semi-conductor switch when a PQM signal is powered at a second logic voltage lower than the first logic voltage to allow a voltage from a GCU to go to the GCB.

15 Claims, 1 Drawing Sheet

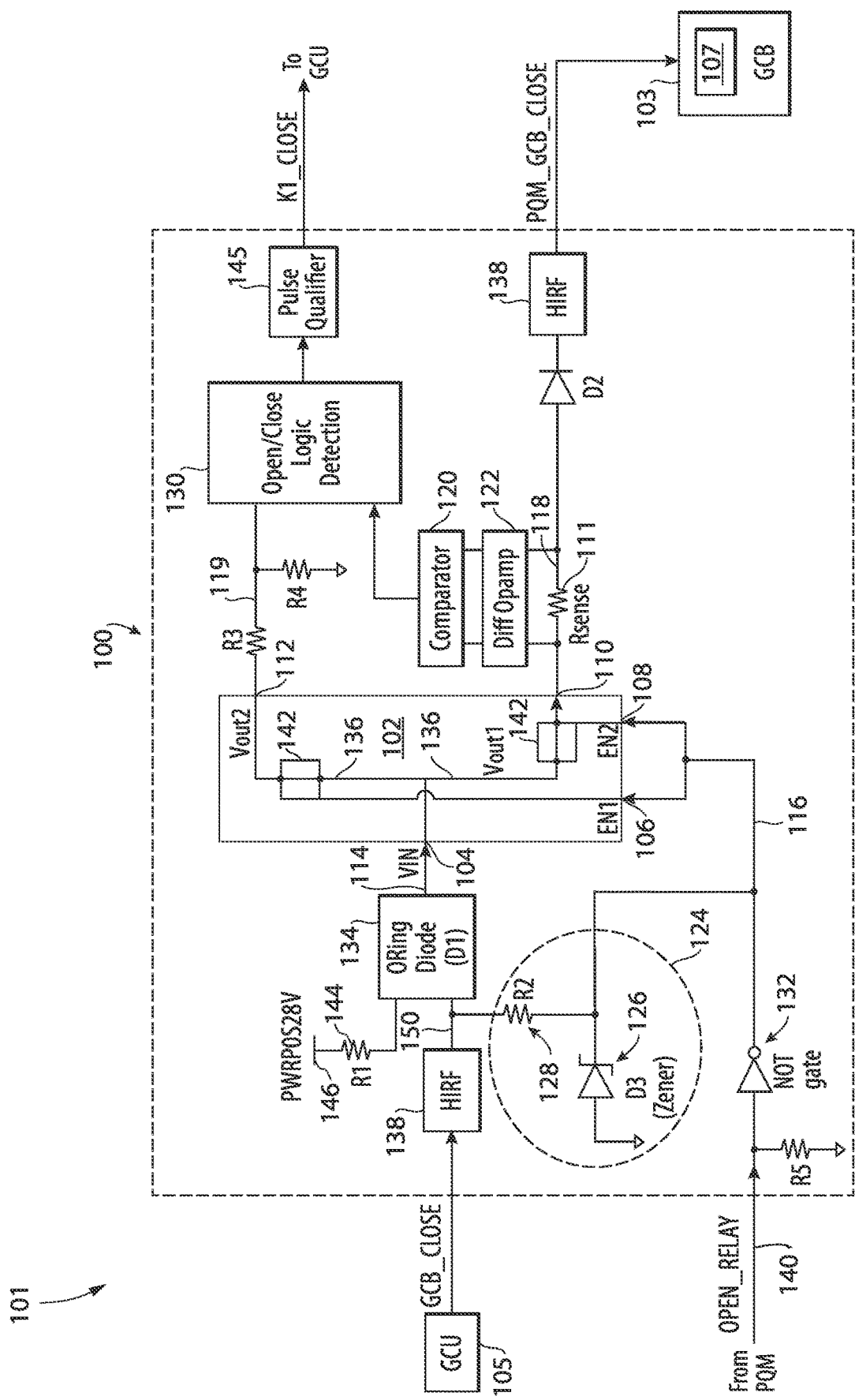

SYSTEMS AND METHODS FOR GENERATOR CONTROL

CROSS-REFERENCE TO RELATED APPLICATIONS

This application claims priority to and the benefit of Indian Application No. 202041016876, filed Apr. 20, 2020, the entire contents of which are herein incorporated by reference in their entirety.

BACKGROUND

Technological Field

The present disclosure relates to power generators, and more particularly to a power quality monitor for a generator control breaker in a generator control unit.

Description of Related Art

In some generator control units, a power quality monitor having a mechanical relay, e.g. a DPDT (double-pole double-throw) relay, acts to control contact in a generator circuit breaker under certain conditions. The power quality monitor and the DPDT relay are typically required to operate at a certain speed under certain conditions. Certain conditions, such as temperature or voltage level, may affect how quickly the DPDT relay responds.

The conventional methods and systems have generally been considered satisfactory for their intended purpose. However, there is still a need in the art for assemblies that provide increased reliability and stability, and reduced complexity, and/or cost. The present disclosure may provide a solution for this need.

SUMMARY

A power quality monitor (PQM) module includes a solid-state semi-conductor switch having a voltage input, two signal inputs and two voltage outputs. A voltage input line is electrically connected to the voltage input. A PQM signal input line is operatively connected to at least one of the two signal inputs. A voltage output line is electrically connected to one of the two voltage outputs to provide power to a load.

In accordance with some embodiments, a differential amplifier is positioned along the voltage output line. A comparator can be positioned along the voltage output line. A circuit can be between the voltage input line and the PQM signal input line. The circuit can include a resistor. The circuit can include a zener diode clamp. The voltage input line can provide 28V. The voltage output line can be a first voltage output line. The PQM module can include a second voltage output line electrically connected to a second of the two voltage outputs to provide sense voltage. The PQM module can include a logic detector along the second voltage output line electrically connected downstream from the second voltage output. The PQM module can include a NOT gate along the PQM signal input line. The PQM module can include a diode along the voltage input line. A power positive voltage input can be electrically connected to the diode. A resistor can be positioned between the power positive voltage input and the diode to limit current from the power positive voltage input when a GCB close voltage is not present along the voltage input line.

In accordance with another aspect, a generator control system includes a generator control unit (GCU). A PQM module is operatively connected to the GCU. The PQM module includes a solid-state semi-conductor switch having a voltage input, two signal inputs and two voltage outputs. A voltage input line is electrically connected to receive a voltage from the GCU and electrically connected to the voltage input. A PQM signal input line is operatively connected to at least one of the two signal inputs. A voltage output line is electrically connected to one of the two voltage outputs. A generator control breaker (GCB) is operatively connected to the voltage output line of the PQM module.

The generator control system can include a differential amplifier along the voltage output line between one of the two voltage outputs and the GCB. The GCU provides 28V to the voltage input line. A comparator can be positioned along the voltage output line between one of the two voltage outputs and the GCB. A diode can be positioned along the voltage input line. A power positive voltage input can be electrically connected to the diode. A resistor can be positioned between the power positive voltage input and the diode to limit current from the power positive voltage input when a GCB close voltage is not present along the voltage input line.

In accordance with another aspect, a method of controlling a generator control breaker (GCB) includes opening a solid-state semi-conductor switch when a power quality monitor (PQM) signal is powered at a first logic voltage. The method includes closing the solid-state semi-conductor switch when a PQM signal is at least one of powered at a second logic voltage lower than the first logic voltage, or unpowered, to allow a voltage from a generator control unit (GCU) to go to the GCB. Opening the solid-state semi-conductor switch can include breaking a close-coil path between the GCU and the GCB to open a coil drive of a GCB.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain FIGURES, wherein:

FIG. 1 is an electrical schematic of a generator control system constructed in accordance with the present invention, showing the solid-state semi-conductor switch.

DETAILED DESCRIPTION

Reference will now be made to the drawings wherein like reference numerals identify similar structural features or aspects of the subject invention. For purposes of explanation and illustration, and not limitation, a partial view of an exemplary embodiment of a generator control system in accordance with the invention is shown in FIG. 1 and is designated generally by reference character 101. Other embodiments of the generator control system in accordance with the disclosure are provided as will be described. The methods and systems of the present disclosure replace the normally closed mechanical relay (double pole double throw (DPDT) normally closed (NC) relay) with a surface mount solid state chip for improved response time and reliability.

As shown in FIG. 1, a generator control system 101 includes a generator control unit (GCU) 105. A PQM module 100, which is a part of a power quality monitor (not shown), is operatively connected to the GCU 105. The PQM module 100 includes a solid-state semi-conductor switch 102. Switch 102 can be a hi-side switch integrated circuit (IC), for example, model numbers TPS2HB08-Q1 or TPS2HB35-Q1, available from Texas Instruments, Inc. Switch 102 has a voltage input 104, two signal inputs 106 and 108, and two voltage outputs 110 and 112. The PQM module provides redundancy for the GCU 105. The voltage input line 114 is electrically connected to the voltage input 104. The GCU 105 provides 28V (e.g. a GCB close voltage) to the switch 102 through the voltage input line 114. The voltage input line 114 is electrically connected to receive a voltage from the GCU 105 and is part of the GCU close-coil path 136. A PQM signal input line 116 is operatively connected to the two signal inputs 106 and 108. A first voltage output line 118 is electrically connected through a current sense resistor 111 ($R_{sense}$) to first voltage output 110 to provide power to a load 107, e.g. a coil of a generator control breaker (GCB). Switch 102 includes a close-coil path 136 that transmits the voltage input from voltage input line 114 to the load 107 when the GCU 105 sends a close-coil command and the OPEN_RELAY control signal (at control input 140) is low (near 0V) or unpowered, e.g. in a high impedance state.

With continued reference to FIG. 1, a circuit 124 is between the PQM voltage input line 150 and the PQM signal input line 116. The circuit 124 includes a zener diode clamp 126. The zener diode clamp 126 acts to clamp the GCB_CLOSE signal to 5V when the PQM is unpowered. When the PQM is unpowered, the OPEN_RELAY control input 140 from the PQM is unpowered. The signal line from 124 creates a 5V signal from the GCB Close signal to power the 106 and 108 enable inputs to the solid-state semi-conductor switch 102 closing the two solid state switches 142 in 102 (shown closed in FIG. 1). The circuit 124 includes a resistor 128. The PQM module 100 includes a second voltage output line 119 electrically connected to second voltage output 112 to a provide sense voltage to a logic detector 130. The logic detector 130 is electrically connected along the second voltage output line 119 downstream from the second voltage output 112. Logic detector 130 acts to detect the coil drive 107 open/close status by monitoring the voltage output 112 and the current from voltage output 110.

With continued reference to FIG. 1, the PQM module 100 includes a NOT gate 132 along the PQM signal input line 116. The NOT gate 132 acts to ensure that the switch 102 is normally closed, e.g. coil drive 107 is connected, to mimic the state of the traditional mechanical switch. The NOT gate 132 is used at a control input 140 of the PQM module, which receives an open relay 5V (OPEN_RELAY) command signal internally generated in PQM when the semi-conductor switch 102 is to be opened (e.g. individual switches 142 also opened). The NOT gate 132 is a tri-state device with high impedance output when it is unpowered. The PQM module 100 includes an ORing diode circuit 134 along the voltage input line 114. Two voltage sources pass through the ORing diode 134. One is the GCB close voltage (GCB_CLOSE-28V) from the GCU 105 and the other is a power positive voltage (pwrpos28V) generated from the PQM module 100 itself. The pwrpos28V is provided at a positive voltage input 146 operatively connected to the ORing diode 134. When coil drive 107 is to be driven closed, the GCB close voltage is the source voltage for switch 102. During BIT (Built In Test) operations, the pwrpos28V signal is used to supply power to switch 102 and monitor the channels for close-coil path 136 health, e.g. the first and second voltage outputs 110 and 112, respectively. A resistor (R1) 144 is positioned between the power positive voltage input 146 and the ORing diode 134 to limit current from the power positive voltage input when a GCB close voltage is not present along the voltage input line. Resistor (R1) 144 acts to limit the current in the close-coil path 136 from pwrpos28V at input 146 when the GCB close voltage is not present. R1 allows the PQM circuitry to be tested during BIT without actually providing enough current to the close the GCB coil 107 during the BIT operation. If a fault in close-coil path 136 is detected by logic detector 130 a signal is sent to a pulse qualifier 144 which then generates a K1_CLOSE output to the GCU indicate that there is a fault in the PQM solid state switch 100.

As shown in FIG. 1, a current sense circuit ($R_{sense}$) is added to monitor the current from the voltage output 110, which is along the close-coil path 136. A comparator 120 and differential amplifier 122 are positioned along the first voltage output line 118 between first voltage output 110 and the GCB 103 to utilize $R_{sense}$ in order to monitor current from the voltage output 110. As such, both the channels (voltage outputs 110 and 112) are monitored, one is voltage monitoring and other channel is monitoring the through current. Both channels output to logic detection circuit 130. The combined output will decide the Close coil path status and will be communicated to the generator control system 101. Those skilled in the art will readily appreciate that a filter 138, e.g. a HIRF (high-intensity radiated field) filter, can be included on output line 118, and/or at the GCB_CLOSE input between the GCU 105 and the ORing diode 134.

A method of controlling a GCB, e.g. GCB 103, includes triggering an enable signal, e.g. EN1 or EN2, and opening a solid-state semi-conductor switch, e.g. switch 102, when a PQM signal (OPEN_RELAY) is powered with a first logic voltage, e.g. a logic high voltage. Opening the solid-state semi-conductor switch includes breaking a close-coil path, e.g. close-coil path 136, between the GCU and the GCB to open a coil drive, e.g. coil drive 107, of the GCB. The method includes closing the solid-state semi-conductor switch when a PQM signal is powered at a second logic voltage lower than the first logic voltage or unpowered to allow a voltage from a GCU, e.g. GCU 105, to go to the coil drive of the GCB. The second logic voltage is considered a logic low voltage (e.g. close to 0V).

Switch 102 provides a cost effective solution with a faster response time and reduced performance variations due to input voltage and temperature, as compared to the DPDP NC relay, where performance often relies on the applied pull-in voltage and temperature. Moreover, switch 102 has enhanced operating vibration range as compared to traditional DPDT NC relays that are mounted through a hole or holes. Moreover, if switch 102 is a surface mounted device, the printed circuit board (PCB) will get better clearance with respect to adjacent boards and mounting panel. The assembly is universal and can be used for any NC coil monitoring across multiple programs.

The methods and systems of the present disclosure, as described above and shown in the drawings, provide for an generator control system with superior properties including increased reliability and stability, and reduced size, weight, complexity, and/or cost. While the apparatus and methods of the subject disclosure have been showing and described with reference to embodiments, those skilled in the art will readily appreciate that changes and/or modifications may be made thereto without departing from the spirit and score of the subject disclosure.

What is claimed is:

1. A power quality monitor (PQM) module, comprising:
   a solid-state semi-conductor switch having a voltage input, two signal inputs and two voltage outputs;
   a voltage input line electrically connected to the voltage input;
   a PQM signal input line operatively connected to at least one of the two signal inputs;
   a voltage output line electrically connected to one of the two voltage outputs to provide power to a load; and
   a diode along the voltage input line, wherein a power positive voltage input is electrically connected to the diode, wherein a resistor is positioned between the power positive voltage input and the diode to limit current from the power positive voltage input when a generator control breaker (GCB) close voltage is not present along the voltage input line.

2. The PQM module of claim 1, further comprising a differential amplifier along the voltage output line.

3. The PQM module of claim 1, further comprising a comparator along the voltage output line.

4. The PQM module of claim 1, further comprising a circuit between the voltage input line and the PQM signal input line.

5. The PQM module of claim 4, wherein the circuit includes a resistor.

6. The PQM module of claim 4, wherein the circuit includes a zener diode clamp.

7. The PQM module of claim 1, wherein the voltage input line provides a nominal 28V.

8. The PQM module of claim 1, wherein the voltage output line is a first voltage output line, wherein the PQM module includes a second voltage output line electrically connected to a second of the two voltage outputs to provide sense voltage.

9. The PQM module of claim 8, further comprising a logic detector along the second voltage output line electrically connected downstream from the second voltage output.

10. The PQM module of claim 1, further comprising a NOT gate along the PQM signal input line.

11. A generator control system, comprising:
    a generator control unit (GCU);
    a power quality monitor (PQM) module operatively connected to the GCU, wherein the PQM module includes:
        a solid-state semi-conductor switch having a voltage input, two signal inputs and two voltage outputs;
        a voltage input line electrically connected to receive a voltage from the GCU and electrically connected to the voltage input;
        a PQM signal input line operatively connected to at least one of the two signal inputs; and
        a voltage output line electrically connected to one of the two voltage outputs;
    a generator control breaker (GCB) operatively connected to the voltage output line of the PQM module; and
    a diode positioned along the voltage input line, wherein a power positive voltage input is electrically connected to the diode, wherein a resistor is positioned between the power positive voltage input and the diode to limit current from the power positive voltage input when a GCB close voltage is not present along the voltage input line.

12. The generator control system of claim 11, further comprising a differential amplifier along the voltage output line between one of the two voltage outputs and the GCB.

13. The generator control system of claim 11, further comprising a comparator along the voltage output line between one of the two voltage outputs and the GCB.

14. The generator control system of claim 11, wherein the GCU provides 28V to the voltage input line.

15. A power quality monitor (PQM) module for controlling a generator control breaker (GCB) the PQM module comprising:
    a GCB close coil voltage input;
    a power positive voltage input;
    a solid-state semi-conductor switch having a voltage input in selective electrical communication with at least one of the GCB close coil voltage input or the power positive voltage input, two signal inputs and two voltage outputs;
    a voltage input line electrically connected to the voltage input;
    a PQM signal input line operatively connected to at least one of the two signal inputs;
    a voltage output line electrically connected to one of the two voltage outputs to provide power to a GCB load; and
    a diode along the voltage input line, wherein the power positive voltage input is electrically connected to the diode, wherein a resistor is positioned between the power positive voltage input and the diode to limit current from the power positive voltage input when a GCB close voltage is not present along the voltage input line.

* * * * *